(12) United States Patent
Huffman

(10) Patent No.: US 6,480,433 B2
(45) Date of Patent: Nov. 12, 2002

(54) DYNAMIC RANDOM ACCESS MEMORY WITH DIFFERENTIAL SIGNAL ON-CHIP TEST CAPABILITY

(75) Inventor: James D. Huffman, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 12 days.

(21) Appl. No.: 09/727,604

(22) Filed: Dec. 1, 2000

(65) Prior Publication Data

US 2002/0093861 A1 Jul. 18, 2002

Related U.S. Application Data

(60) Provisional application No. 60/168,525, filed on Dec. 2, 1999.

(51) Int. Cl.[7] .................................................. G11C 7/00
(52) U.S. Cl. .................... 365/201; 365/207; 365/230.08
(58) Field of Search ................................. 365/201, 207, 365/205, 230.03, 230.06, 149

(56) References Cited

U.S. PATENT DOCUMENTS 5,796,671 A * 8/1998 Wahlstrom ............. 365/230.03
6,185,119 B1 * 2/2001 Haeberli et al. ............ 365/207
6,335,896 B1 * 1/2002 Wahlstrom ............. 365/230.03

* cited by examiner

*Primary Examiner*—Huan Hoang
*Assistant Examiner*—Gene N. Auduong
(74) *Attorney, Agent, or Firm*—Charles A. Brill; Wade James Brady, III; Frederick J. Telecky, Jr.

(57) ABSTRACT

A differential amplifier circuit used to test the underlying DRAM memory cells in large area spatial light modulator (SLM) arrays by significantly increasing the cell capacitance to bitline capacitance ratio. Since for these SLM devices it is not desirable to sub-divide the DRAM array into smaller test arrays in order to reduce the bitline capacitance, this invention addresses the bitline capacitance problem by reading the differential voltage between two adjacent cells rather than the actual voltage of each cell. The approach is to load, precharge, and readout a checkerboard pattern and then repeat the process for an inverse checkerboard pattern. Cell outputs which have the same value for the two complimentary patterns indicate a cell failure. In this approach, the cell differential voltage readout is effectively doubled to approximately ±200 mVolts, providing 100% test coverage of these large area arrays. This results in an effective DRAM test procedure which is independent of bitline capacitance.

13 Claims, 3 Drawing Sheets

DYNAMIC RANDOM ACCESS MEMORY WITH DIFFERENTIAL SIGNAL ON-CHIP TEST CAPABILITY

This application claims priority under 35 USC § 119(e)(1) of provisional application No. 60/168,525 filed Dec. 2, 1999.

BACKGROUND OF THE INVENTION

1. Field of the Invention

The present invention relates to the design to test properties of DRAM circuits and particularly to underlying DRAM's in optical spatial light modulators.

2. Description of the Related Art

An important characteristic of any memory circuit is its ability to be automatically tested at the chip level. A typical DRAM cell 100, comprised of a NMOS transistor 101 and a storage capacitor 102, is shown in FIG. 1. Such memory cells are arranged in a matrix made up of rows and columns, where the columns are connected together and the rows are connected together. A wordline signal is used to address the various rows in the array while a bitline is used to address the columns. In testing the array, the binary state of each cell is read out and observed for correctness. One of the problems encountered in testing a DRAM array where all the bitlines in a column of cells are connected together is that the inherent bitline capacitance 103 can be large relative to the cell capacitance 102. This can result in very small cell readout differential voltages, as illustrated by the following voltage capacitance relationship:

$$\text{Vdifferential\_swing} = \frac{C_1}{C_2}(V_1 - V_2)$$

where $C_1$ and $C_2$ are capacitors 102 and 103, respectively, $V_1$ is the cell output voltage, and $V_2$ is the bitline precharge voltage, $V_{EE}/2$, shown in FIG. 1. As can be seen from the equation, as the bitline capacitance, $C_2$, becomes large relative to the cell storage capacitance $C_1$, the readout differential voltage can become quite small.

In typical DRAM circuits, the bitline capacitance problem discussed above is overcome by breaking the DRAM array 200 into several cell banks 201–204 (four shown), as shown in FIG. 2. This allows the relationship between the capacitance of capacitors $C_1$ and $C_2$ to remain small enough that adequate cell readout voltages are obtainable.

However, the DRAM cells used as the underlying memory structure in large area spatial light modulators, such as digital micromirror devices (DMD), as shown in FIG. 3, are not necessarily conducive to being broken into banks since the mirrors are typically all connected together. In these large area arrays the large bitline capacitance can completely override the cell voltage during the readout test mode making it extremely difficult to test the memory array with conventional methods. As a result, an innovative method is needed for 100% testing the DRAM cells in these large area arrays. This invention solves this testing problem with an effective differential readout method and circuit for automatically testing the large area DRAM memory cells in these devices.

SUMMARY OF THE INVENTION

This invention discloses a differential amplifier circuit used to test underlying DRAM memory cells in large area spatial light modulator arrays by significantly increasing the cell capacitance to bitline capacitance ratio for the devices. Since these large area optical arrays can't be sub-divided into smaller banks for testing, as in the case of standard DRAM memory chips, the large bitline capacitance overrides the cell capacitance to the extent that it's difficult to readout the cell voltage. This invention overcomes the problem created by the large bitline capacitance.

The differential amplifier circuit of this invention compares each bitline with its adjacent bitline on a cell-to-cell basis. By loading a checkerboard pattern, reading out the results, loading an inverse checkerboard pattern, and reading out again, 100% test coverage of the array is accomplished. In this manner, the differential voltage readout is effectively doubled, to:

$$\text{Vreadout} = \left|2\frac{C_1}{C_2}(V_1 - V_2)\right|$$

In this case, the true data is not read, as in a conventional DRAM, but rather the differential voltage of a cell compared with it's adjacent cell is readout. This technique provides an effective DRAM test procedure which is independent of bitline capacitance.

DETAILED DESCRIPTION

Figure 1:
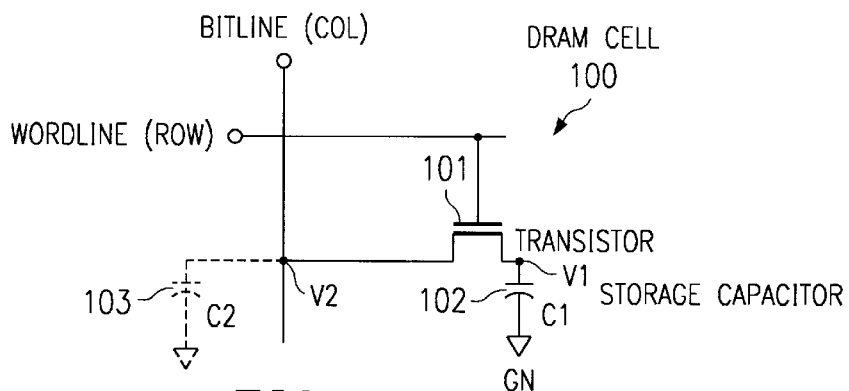
FIG. 1 is a schematic for a typical DRAM cell. (related art)
Figure 2:
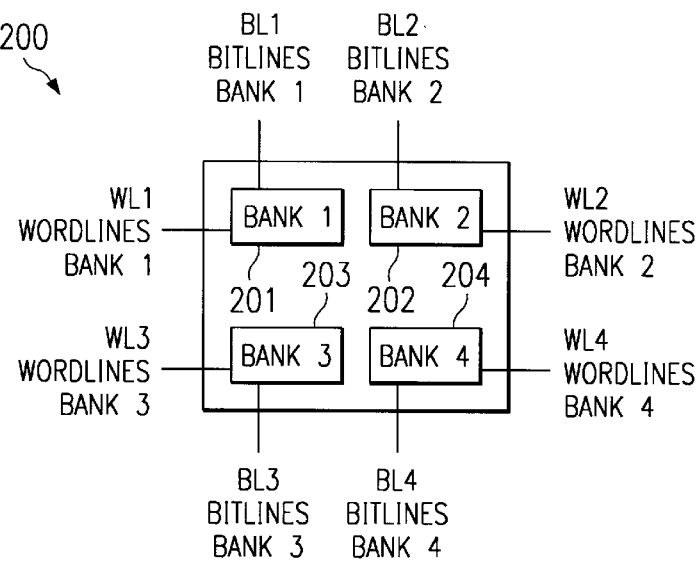
FIG. 2 illustrates the cell banks for a typical DRAM chip. (related art)
Figure 3:
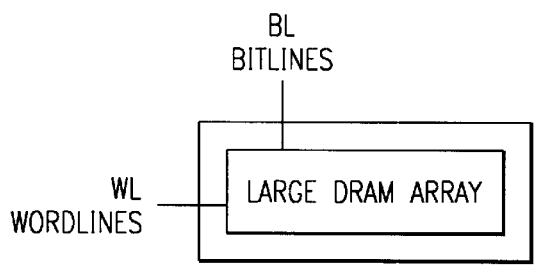
FIG. 3 illustrates a single large cell bank for a typical optical spatial light modulator. (related art)

This invention solves the problem of automatic testing of large area DRAM memory arrays, such as those used in spatial light modulators like the DMD, due to the large bitline capacitance for these devices. As discussed earlier, these large area arrays cannot conveniently be broken into smaller sub-arrays for testing purposes, due to the construction of the optical mirror superstructure on top of the memory array, but rather are addressed as a single DRAM memory array, as shown in FIG. 3.

Figure 4:
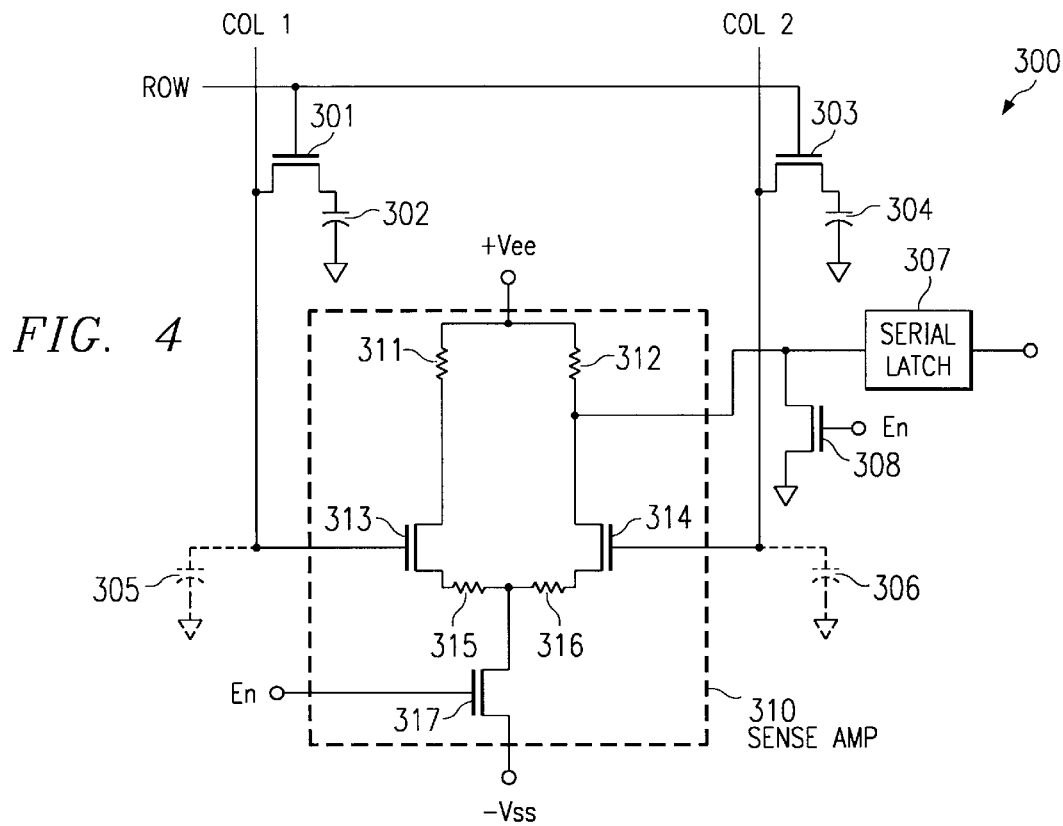
FIG. 4 is a schematic for the basic DRAM cell readout circuit of this invention.

FIG. 4 is a schematic of the circuit 300 of this invention used for testing a large area DRAM memory array. In this approach a differential sense amplifier circuit 310 is used to compare each bitline, on a cell-to-cell basis, with its adjacent bitline. The sense amplifier 310 is basically a differential amplifier comprised of two circuit legs with drain resistors 311 and 312, transistors 313 and 314, source resistors 315 and 316, and a current sink transistor 317. The two drain resistors 311 and 312 are tied together at one end and connected to a $V_{EE}$ voltage source and the current sink transistor 317 is connected to a $-V_{SS}$ source (often gnd) and used to sink the current from the differential amplifier 310. However, in addition to the standard differential amplifier 310, a serial latch 307 is added, along with transistor 308 which is used to unbalance the differential amplifier such as to read zero volts if there is a failure in the DRAM cell. Both the differential sense amplifier 310 and the unbalance transistor 308 are controlled from an enable (EN) signal. The test data is read from the serial latch 307 in the form of a binary "1" and "0" bit-stream. A differential sense amplifier 310 is included between each pair of adjacent columns in the DRAM array. The array as illustrated in FIG. 4 is comprised of two of these cells, consisting of a transistor and a storage capacitor 301/302 and 303/304, respectively. As shown, the cells in the array are addressed in columns and rows with the sense amplifier of this invention connected between adjacent columns. Capacitors 305 and 306 represent the rather large bitline capacitance which is inherent in these large DRAM memory arrays. It is this large capacitance which overrides the cell capacitance (302 or 304) and prevents the readout of a true voltage value for an individual cell. Instead of reading out data from one cell, the difference amplifier compares each cell connected to a bitline with it's corresponding cell in the adjacent bitline (columns 1 & 2 in this case). In operation, a checkerboard pattern is loaded into the array, the array is readout, and then an inverse checkerboard pattern is loaded in and readout. This provides 100% test coverage of the array cells. The true data is not read out, but rather the differential voltage between two adjacent cells. In this mode, the differential amplifier effectively doubles the amplitude of the readout signal from that of a standard DRAM array to provide an output of approximately ±200 mVolts.

Figure 5:
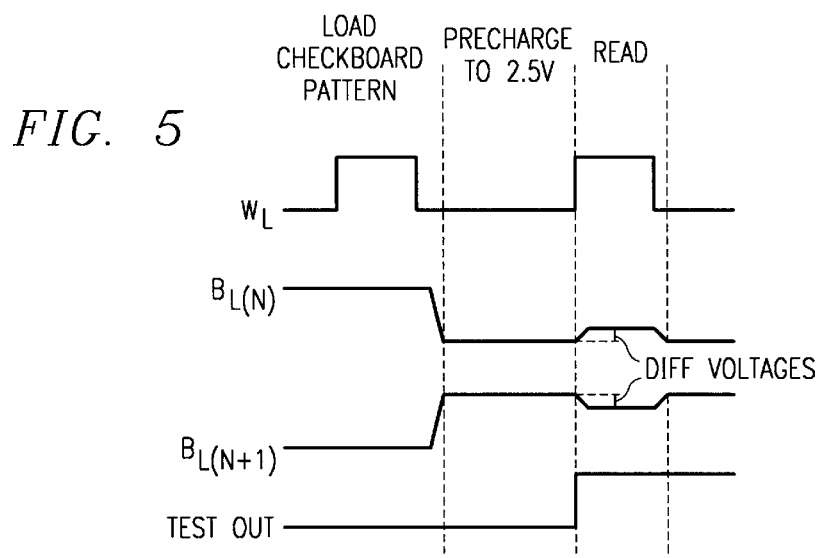
FIG. 5 is a clocking diagram showing the pulse waveforms for operating the differential DRAM test circuit of this invention.

The operation of the circuit of this invention is illustrated by the waveforms of FIG. 5. As shown, after loading in a checkerboard pattern into the array, the bitlines are precharged to approximately $V_{EE}/2$. For the checkerboard pattern shown, cell 1 with a 'white' checkerboard pattern, will then pull-up the bitline (BL(N)) to approximately $(V_{EE}/2)+(C_{11}/C_{21})(V_{11}-V_{21})$ volts and cell 2, with a 'black' checkerboard pattern, will pull-down the bitline (BL(N+1)) to approximately $(V_{EE}/2) +(C_{12}/C_{22})(V_{,12}-V_{22})$ volts. Then the results are readout with a differential voltage of approximately:

$$\left|\frac{C_{11}}{C_{21}}(V_{11} - V_{21})\right| + \left|\frac{C_{12}}{C_{22}}(V_{12} - V_{22})\right|$$

Next, an inverse checkerboard pattern is loaded into the array and the precharge and readout process is repeated. A failed cell is indicated when the same value for both the checkerboard and inverse checkerboard patterns are readout. This procedure effectively provides a doubling of the differential margin and thereby enables an array with large bitline capacitance to be tested. As mentioned in FIG. 4, a transistor 308 is included in the sense amplifier which weighs the differential amplifier to one side such as to read out zero volts if both input signals are the same, indicating a failed cell. This architecture has improved reliability since both poles of the differential amplifier are operated in the differential mode with the common mode being ≈2.5 volts and the differential mode at ≈400 mVolts.

Figure 6:
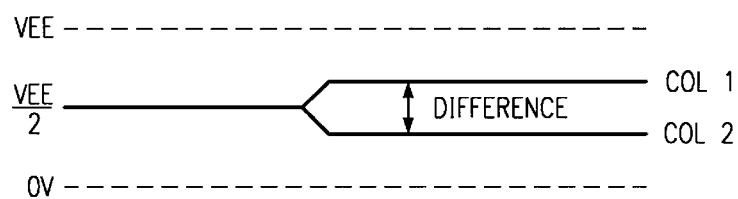
FIG. 6 shows the readout signal level for the circuit of this invention.

FIG. 6 shows the results of the circuit of this invention when biased from 0 to +5 volts and precharged to a middle level of approximately +2.5 volts. As shown, the differential amplifier output signal for a cell between two adjacent columns (column 1 and column 2 in this example) is on the order of +200 mVolts or 400 mVolts peak-to-peak.

Figure 7:
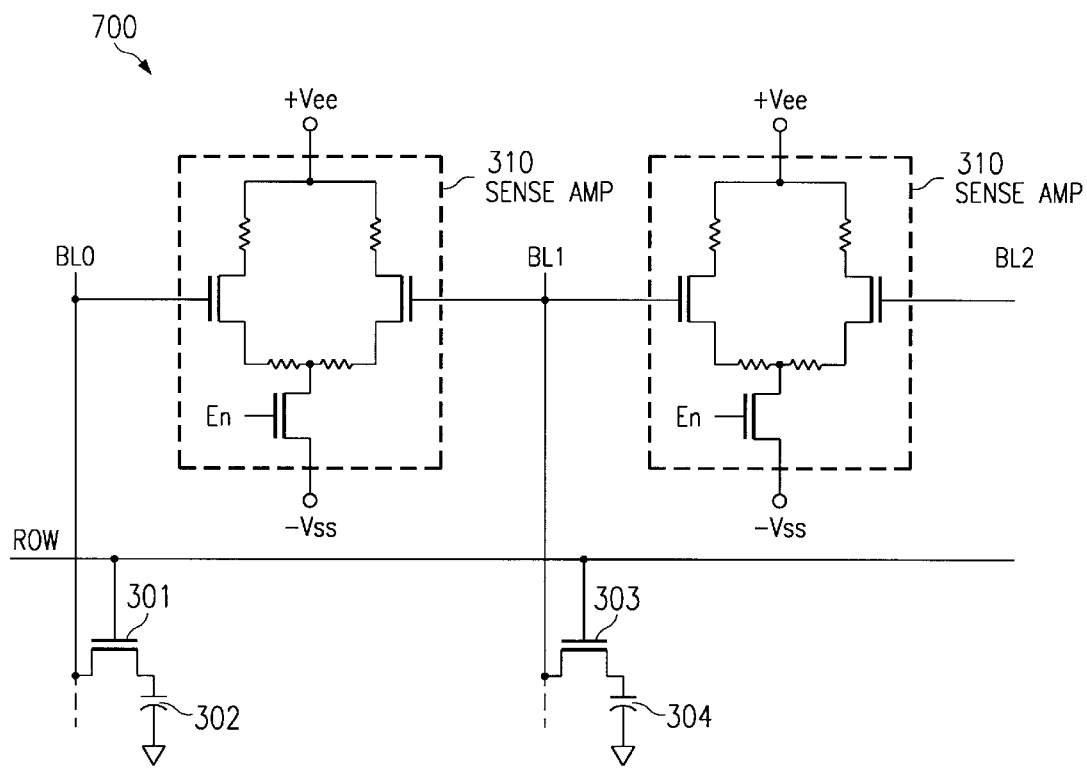
FIG. 7 is a schematic illustrating how the differential test circuit of this invention is used to test an entire DRAM array.

FIG. 7 is a schematic showing how the sense amplifiers 310 are included between each bitline in the DRAM array to provide the design for a built-in test mode for a DRAM chip. This method of loading a checkerboard pattern and testing and then loading an inverse checkerboard pattern and testing again, allows for 100% test coverage to be obtained. Again, the true data is not read from the cell as in the case of a standard DRAM, but rather the differential signal between two adjacent cells is readout. This prevents the need to breakup the DRAM array into smaller portions of cells for testing purposes in order to overcome the large bitline capacitance problem and as a result is much more beneficial for use in spatial light modulator DRAM applications.

Figure 8:
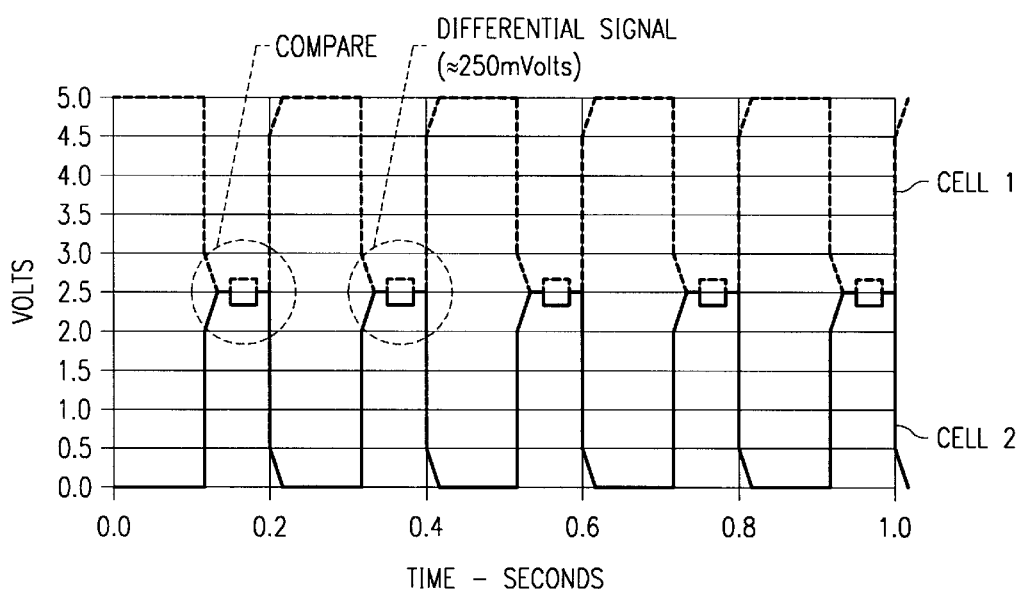
FIG. 8 shows test data from a typical DRAM test using the techniques of this invention.

FIG. 8 shows actual test data taken from a test chip. This shows the two cells (cell 1 and cell 2) being preset from 0 and +5 volts, respectively, to +2.5 volts and then pulling the storage capacitor levels up and down, respectively, as describe above. In this case the output signal was approximately 250 mVolts peak-to-peak.

The methodology of this invention, where the differential between two adjacent cells is readout rather than the actual voltage of the cell, significantly increases the cell capacitance to bitline capacitance ratio needed for effectively reading out test data from the DRAM array in large area spatial light modulators.

I claim:

1. A method for testing an unsegmented large area DRAM array, comprising:

loading said array with a checkerboard pattern so that adjacent memory cells store opposite data states;

coupling each of a plurality of memory cells in a row of the array to an associated bitline;

for each of a plurality of pairs of adjacent bitlines, producing a first output voltage corresponding to a voltage differential between the adjacent bitlines of the pair;

loading said array with an inverse checkerboard pattern so that the pairs of adjacent memory cells store opposite data states, opposite from those of the checkerboard pattern;

for each of the plurality of pairs of adjacent bitlines, producing a second output voltage corresponding to a voltage differential between the pair of adjacent bitlines;

comparing the first and second output voltages for each pair of adjacent bitlines.

2. The method of claim 1 further comprising:

serially latching the first and second output voltages for each pair of bitlines.

3. The method of claim 2 wherein the producing steps each comprise coupling the pair of adjacent bitlines to a differential amplifier;

and further comprising:

unbalancing the differential amplifier during the producing steps, so as to provide a zero volts output responsive to a pair of adjacent memory cells storing the same data state.

4. The method of claim 3 further comprising:

precharging the bitlines to $V_{EE}/2$ volts prior to each producing step.

5. The method of claim 4 wherein cell failures are indicated by adjacent memory cells having first and second output voltages that are substantially the same for said checkerboard and said inverse checkerboard patterns.

6. In an integrated circuit having an unsegmented large area DRAM array including a plurality of word lines, a plurality of bit lines, and a plurality of memory cells arranged in rows and columns, each memory cell including a memory cell and a select transistor, the select transistor having a conduction path connected to its storage capacitor and to a bit line of its associated column, and having a control electrode connected to a word line of its associated row, a circuit for testing the DRAM array comprising:

a first differential sense amplifier having inputs connected to a pair of associated adjacent bit lines in the DRAM array, for generating an output signal corresponding to a differential voltage presented by a pair of memory cells, each associated with one of the pair of associated adjacent bit lines and associated with a selected row;

a serial output latch having an input connected to the first differential sense amplifier;

an unbalance transistor associated with the first differential sense amplifier and used to unbalance one side of said first differential sense amplifier; and an circuit enable input, coupled to the first differential sense amplifier and to the unbalance transistor.

7. The circuit of claim 6 further comprising a plurality of said differential sense amplifiers connected between each pair of adjacent bitlines in said unsegmented large area DRAM array.

8. The circuit of claim 6 wherein the unbalance transistor comprises a conduction path connected between a reference voltage and the output of said first differential sense amplifier, and a control electrode connected to receive an enable signal from the circuit enable input; and wherein the output of said serial output latch provides a binary data-stream output.

9. The circuit of claim 8 wherein the common mode operating voltage of said differential sense amplifier is $\cong$+2.5 volts.

10. The circuit of claim 8 wherein the differential mode output voltage is approximately 400 mVolts peak-to peak.

11. The circuit of claim 8 wherein the first differential sense amplifier produces a first output signal responsive to the pair of memory cells in the selected row storing opposite data states in a checkerboard parttern and produces a second output signal responsive to the pair of memory cells in the selected row storing opposite data states in an inverse checkerboard pattern.

12. The circuit of claim 11 wherein when inputs of said first differential sense amplifier are precharged to +2.5 volts, and opposite data states are stored by the pair of memory cells in the selected row:

the "high" input pulls-up from 2.5 volts to approximately 2.7 volts; and the "low" input pulls-down from 2.5 volts to approximately 2.3 volts.

13. The circuit of claim 11 wherein a DRAM cell failure is indicated responsive to the serial output latch receiving substantially identical first and second differential output signals from the first differential sense amplifier for a pair of memory cells in the selected row.

* * * * *